(12) United States Patent  
Chen (10) Patent No.: US 7,143,492 B2
(45) Date of Patent: Dec. 5, 2006

(54) PRINTED CIRCUIT BOARD DEFECTIVE AREA TRANSPLANT REPAIR METHOD

(75) Inventor: Chih-Chung Chen, Sijhih (TW)

(73) Assignee: Shiou Shenq Technology Co., Ltd., Taoyuan County (TW)

( * ) Notice: Subject to any disclaimer, the term of this patent is extended or adjusted under 35 U.S.C. 154(b) by 340 days.

(21) Appl. No.: 10/832,321

(22) Filed: Apr. 27, 2004

(65) Prior Publication Data

US 2005/0235490 A1    Oct. 27, 2005

(51) Int. Cl.
*B23P 19/04*    (2006.01)

(52) U.S. Cl. .............................. 29/402.08; 29/402.01; 29/402.03; 29/402.04; 29/402.05; 29/402.06; 29/402.09; 29/402.11; 29/402.21; 29/830; 174/250; 174/255

(58) Field of Classification Search ................. 29/830, 29/831, 402.01–402.08, 832, 402.09, 402.11, 29/402.12, 402.21; 174/250, 255
See application file for complete search history.

(56) References Cited

U.S. PATENT DOCUMENTS 3,765,076 A * 10/1973 Brandt ..................... 29/860

6,195,881 B1 * 3/2001 Giardina et al. .............. 29/846
7,008,236 B1 * 3/2006 Wabiszczewicz ............ 439/65
7,017,248 B1 * 3/2006 Choi et al. ............... 29/402.08

* cited by examiner

*Primary Examiner*—Rick Kiltae Chang
(74) *Attorney, Agent, or Firm*—Rosenberg, Klein & Lee

(57) ABSTRACT

A printed circuit board defective area transplant repair method in which printed circuit boards that are determined to be defective undergo a series of reworking procedures comprised of plotting the printed circuit board area block plan, selecting the printed circuit boards, cutting out the area blocks, cutting the selected area blocks, applying the adhesive and fitting area blocks, adjusting the area block alignment, roller tamping the plastic band, curing the adhesive, and tearing off the plastic band. Following the reworking operations, defective printed circuit boards are restored into a good products capable of continuous use such that printed circuit board fabrication and production is even more economical and environmentally protective and, furthermore, printed circuit board manufacturing reaches maximum utilization rates, thereby effectively increasing practical production value.

5 Claims, 9 Drawing Sheets

PRINTED CIRCUIT BOARD DEFECTIVE AREA TRANSPLANT REPAIR METHOD

BACKGROUND OF THE INVENTION

1) Field of the Invention

The invention herein relates to a printed circuit board defective area transplant repair method, specifically referring to an approach wherein printed circuit boards that are determined to be defective undergo a series of reworking procedures, following which the defective printed circuit boards are restored into good products capable of continuous use such that printed circuit board fabrication and production is even more economical and environmentally protective and, furthermore, printed circuit board manufacturing rates reach maximum utilization rates, thereby effectively increasing practical production value.

2) Description of the Prior Art

Since printed circuit board defects occur for various reasons during the production process, conventional printed circuit boards typically require instrument inspection after completion to determine which are good products. All printed circuit board pin contacts are examined, with a cable connected to a computer enabling the detection of broken traces on the circuit board and elsewhere to thereby determine if a circuit board is a good product.

Additionally, since printed circuits boards have conductive traces of high quantity and density, when breakage occurs in the traces printed on the circuit board to the extent that the board is determined to be defective, the said defective printed circuit board is considered scrap and thrown away because the said printed circuit board cannot be repaired. Obviously wasteful and uneconomical production shortcomings, this also results in a large volume of discarded and non-recyclable printed circuit boards that give rise to secondary pollution, environmental protection problems. Of course, that such printed circuits have undergone numerous fabrication processes but must be disposed as scrap just for certain trace printing faults significantly lessens printed circuit board utilization rates and increases production costs.

SUMMARY OF THE INVENTION

The primary objective of the invention herein is to provide a printed circuit board defective area transplant repair method wherein printed circuit boards that are determined to be defective undergo a series of reworking procedures, following which the defective printed circuit boards are restored into good products capable of continuous use such that printed circuit board fabrication and production is even more economical and environmentally protective and, furthermore, printed circuit board manufacturing rates reach maximum utilization rates, thereby effectively increasing practical production value.

DETAILED DESCRIPTION OF THE INVENTION

Figure 1:
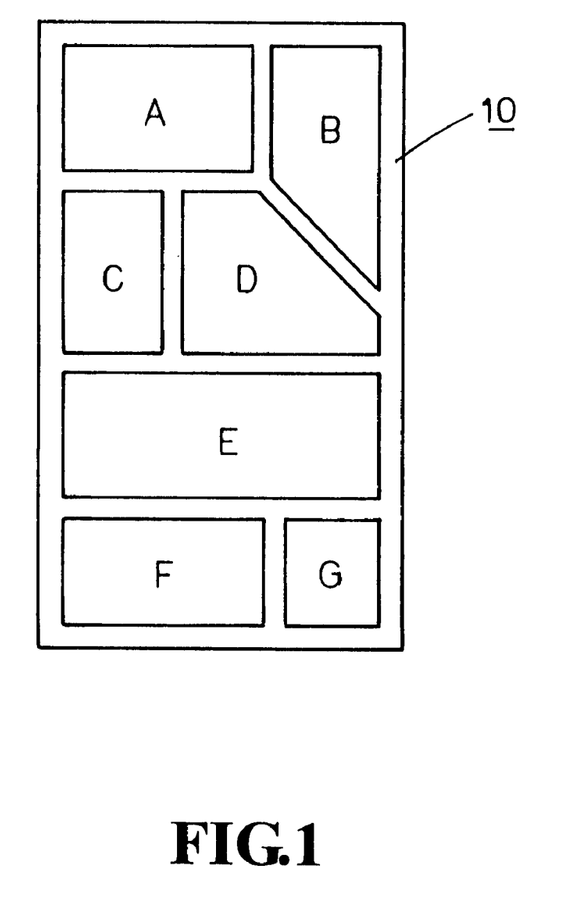
FIG. 1 is an orthographic drawing of the invention herein that illustrates the area block plan of a defective printed circuit board based on the circuit layout.

Referring to FIG. 1 to FIG. 14, the printed circuit board defective area transplant repair method of the invention herein consists of restoring defective printed circuit boards into good, continuous-use products through a series of reworking procedures, wherein the said series of reworking procedures are:

1. Plot the circuit board area block plan: Inspect same model printed circuit boards to determine which have circuit trace faults and first plot an area block plan based on the circuit layout; as indicated in FIG. 1, the embodiment herein consists of plotting seven area blocks A, B, C, D, E, F, and G based on the layout of a circuit board 10, wherein preferably no circuit trace is crossed between each area block.

Figure 2:
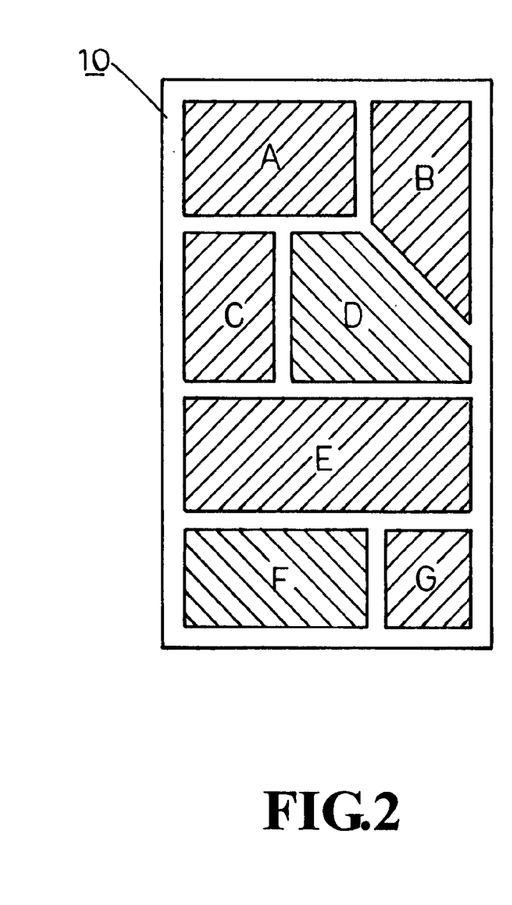
FIG. 2 is an orthographic drawing of the invention herein in which a defective printed circuit board is selected as the circuit board to be repaired.
Figure 3:
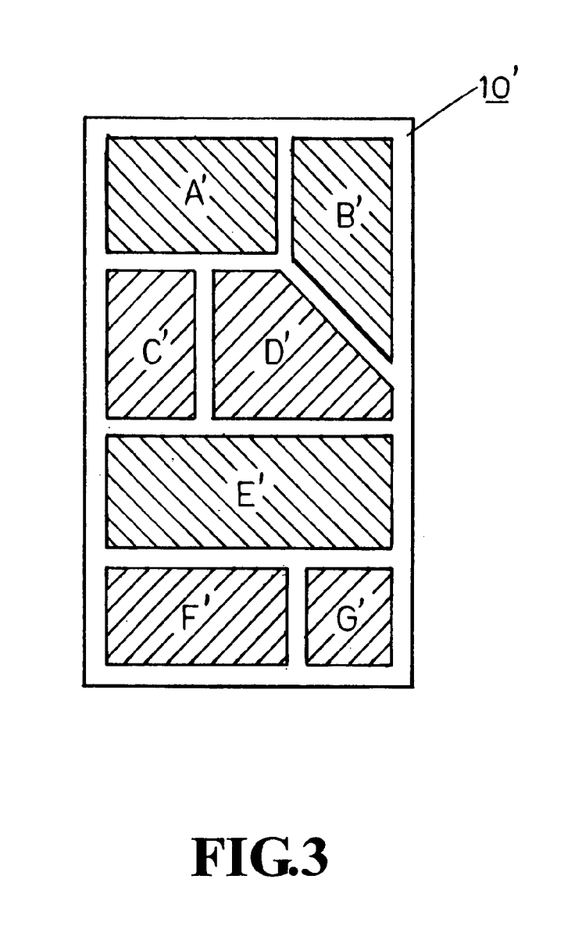
FIG. 3 is an orthographic drawing of the invention herein in which a defective printed circuit is selected as the circuit board providing for the repair.
Figure 4:
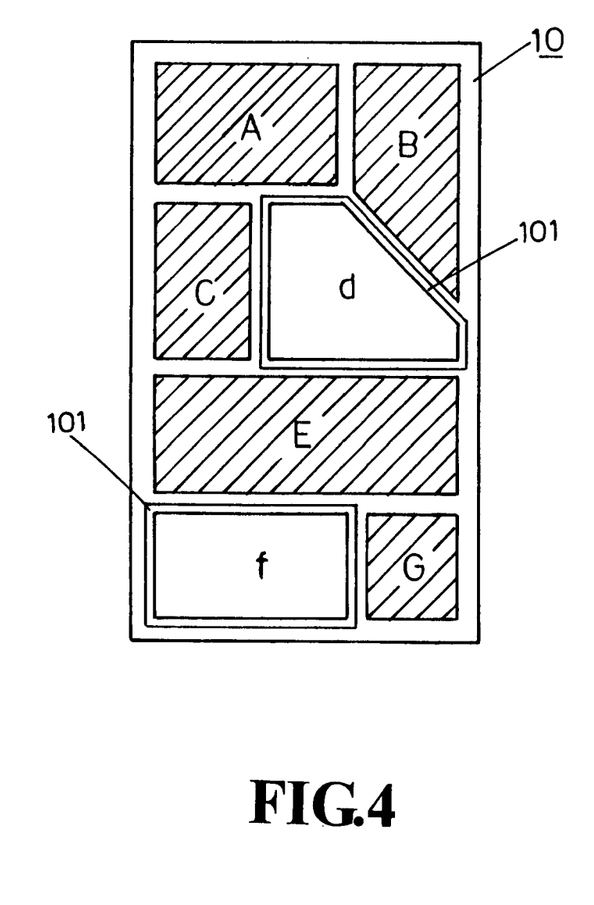
FIG. 4 is an orthographic drawing of the invention herein that shows the defective area blocks cut out of the printed circuit to be repaired.
Figure 5:
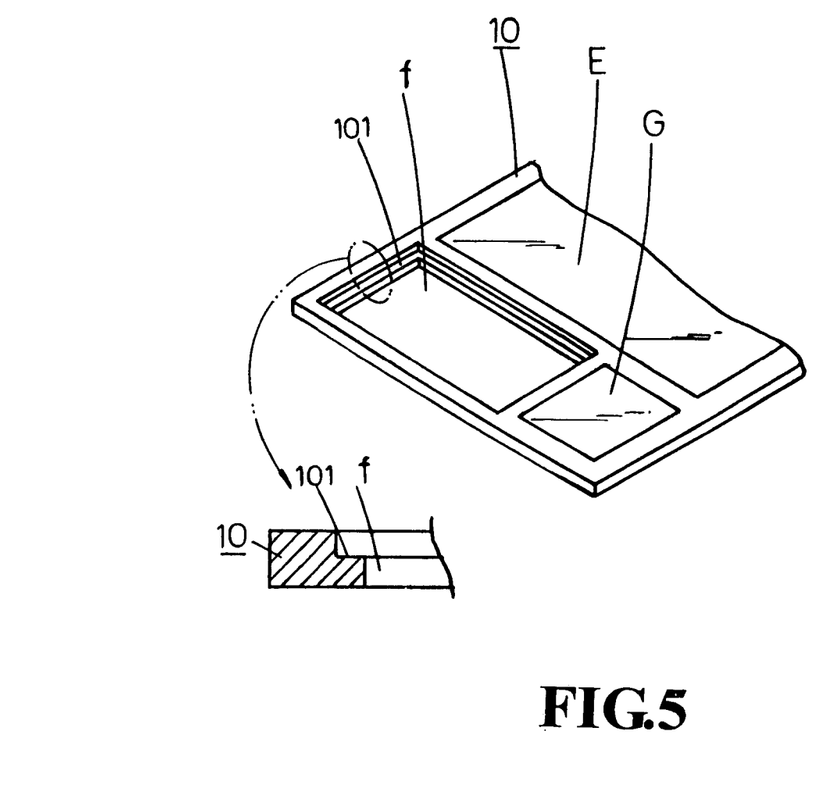
FIG. 5 is an isometric and partial cross-sectional drawing of FIG. 5.
Figure 6:
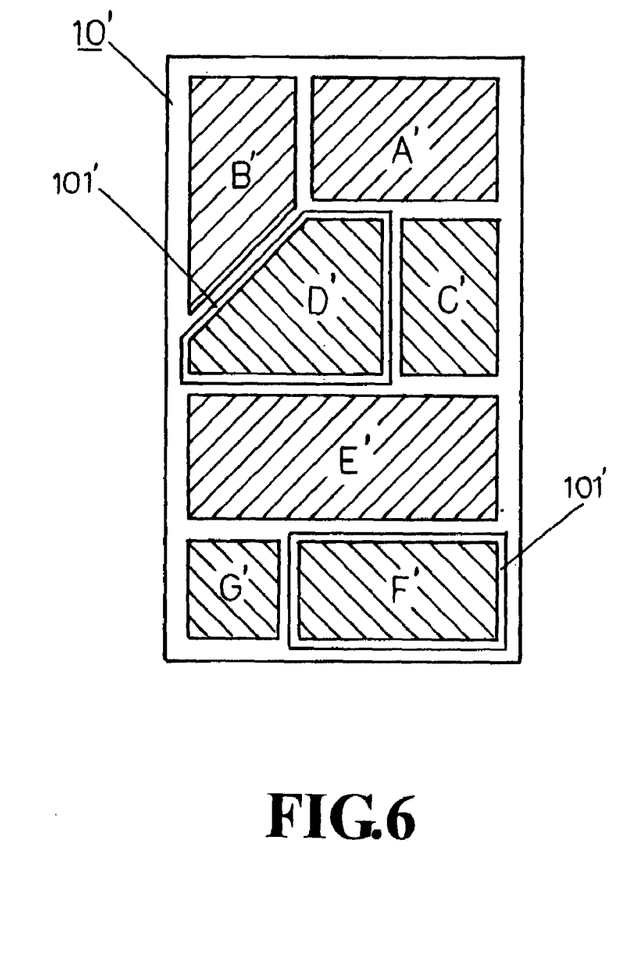
FIG. 6 is an orthographic drawing of the invention herein that shows the selected area blocks in the printed circuit board providing for the repair.
Figure 7:
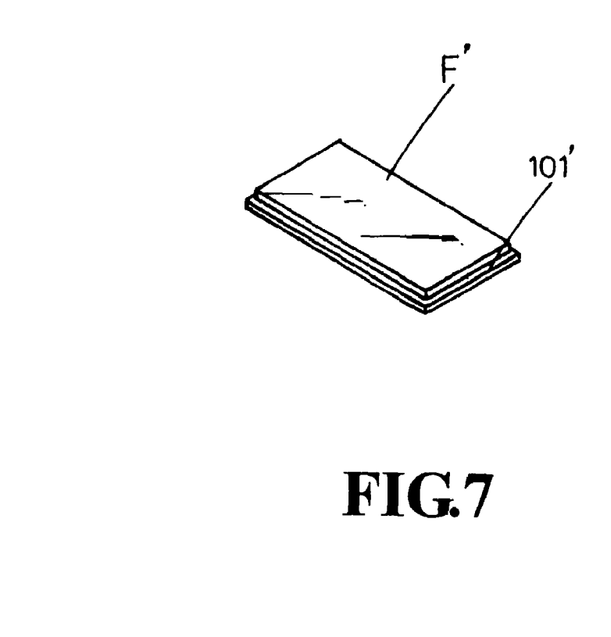
FIG. 7 is an isometric drawing of the invention herein that shows an individuated area block after cutting and removal.
Figure 8:
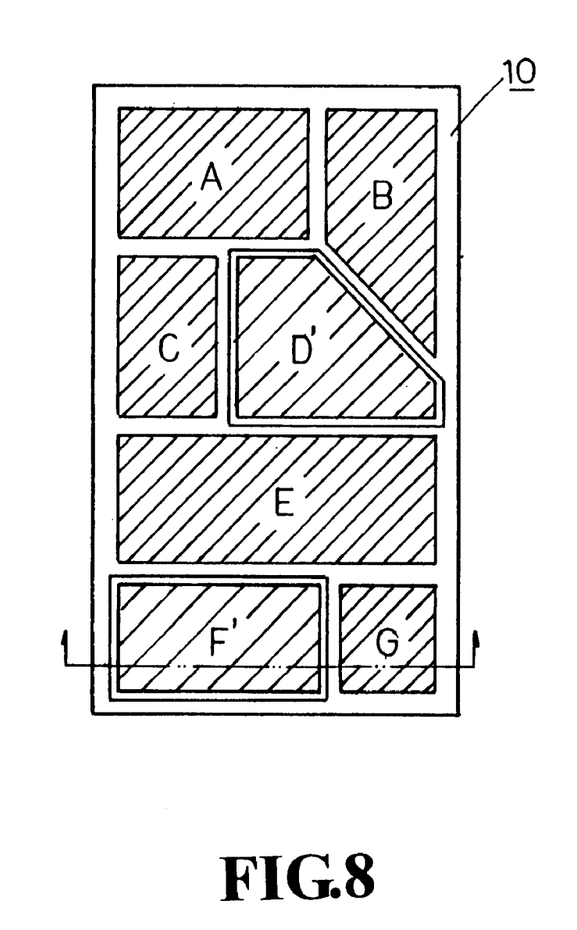
FIG. 8 is an orthographic drawing of the invention herein that shows a cut out individuated area block cemented into the printed circuit.
Figure 9:
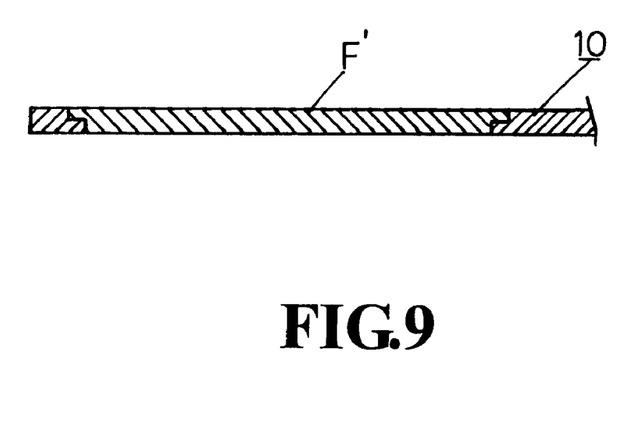
FIG. 9 is an isometric drawing of FIG. 8.
Figure 10:
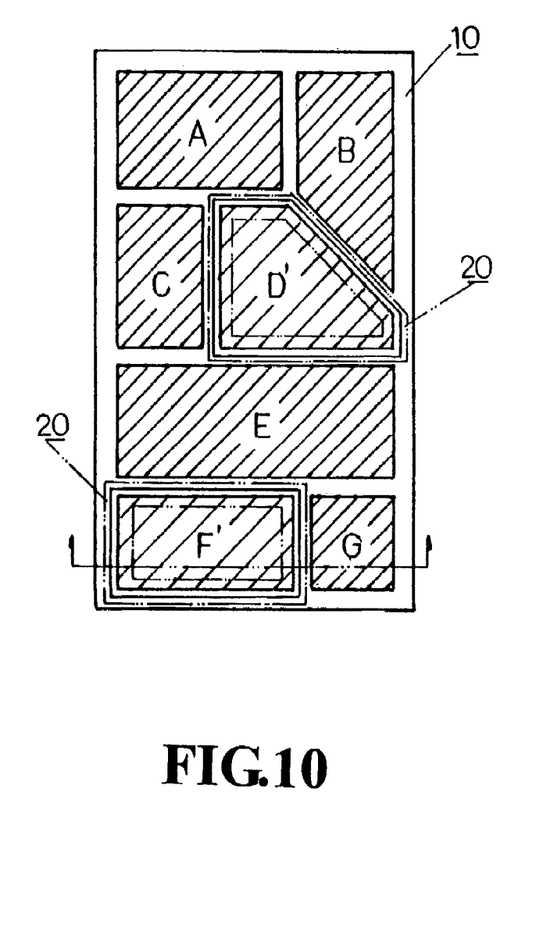
FIG. 10 is an orthographic drawing of the invention herein that shows the plastic band adhesively masked over the outer peripheries of the individuated area blocks of the printed circuit board.
Figure 11:
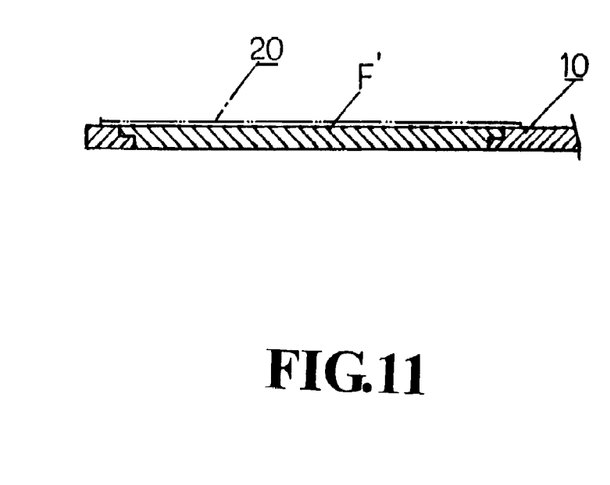
FIG. 11 is a cross-sectional drawing of FIG. 10.
Figure 12:
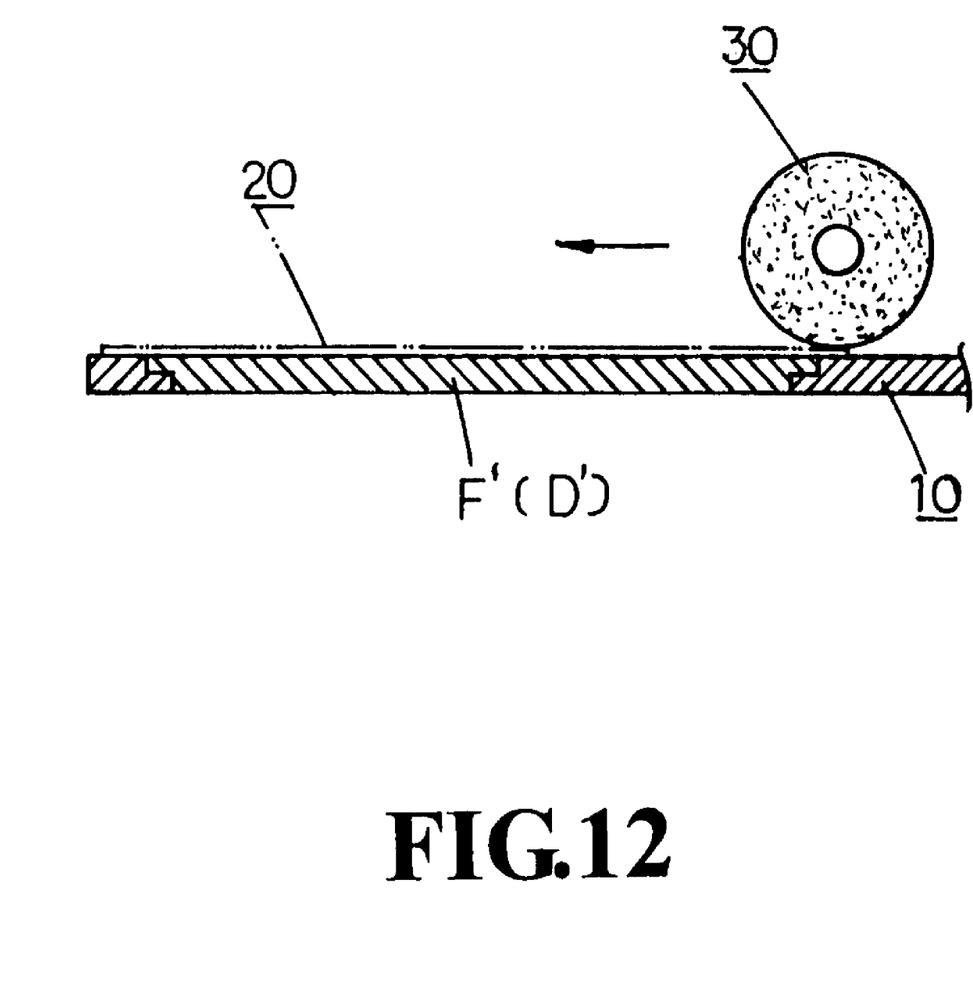
FIG. 12 is a cross sectional drawing of invention herein that shows the rubber roller tamping the upper surface of the plastic band.

2. Designate the printed circuit boards: Sort the printed circuit boards by defective area block quantities to select the best order of printed circuit board repair; as indicated in FIG. 2 and FIG. 3, in the embodiment of the invention herein, the printed circuit board 10 (see FIG. 2) having only two defective area blocks D and F is designated as the circuit board awaiting repair and another circuit board 10' having three defective area blocks A', B', and E' (see FIG. 3, the remaining four area blocks C', D', F' and G' are good areas) is designated as the circuit board that provides for the repair.

3. Cut out the area blocks: Utilizing a CNC bench mill, accurately cut out the defective area blocks D and F of the printed circuit board 10 designated to be repaired, leaving the empty area blocks d and f (see FIG. 4) and, furthermore, similarly mill a stepped bonding section 101 (FIG. 4 and FIG. 5) along the interior edges of the empty area blocks d and f.

4. Cut the selected area blocks: Place the reverse surface of the printed circuit board 10' designated to provide for the repair on the CNC bench mill, precisely cut the selected repair-use area blocks D' and F' along their plotted edges such that they are slightly smaller in size than the corresponding empty area blocks d and f of the printed circuit board 10 to be repaired, and mill a stepped bonding section 101' along the outer edges of the individuated area blocks D' and F' (see FIG. 6 and FIG. 7).

5. Apply the adhesive and fit the area blocks: Apply liquid adhesive on the stepped bonding sections 101 of the empty area blocks d and f in the printed circuit board 10 being repaired and fit in the corresponding individuated area blocks D' and F' of the said printed circuit board 10' designated to provide for the repair (see FIG. 8 and FIG. 9).

6. Adjust the area block alignment: Use an optical positioning instrument to adjust the cemented placement of the individuated area blocks D' and F' in the printed circuit board 10 under repair such that they are accurately seated at the predetermined locations of the printed circuit board 10.

7. Roller tamp the plastic band: Adhesively mask a plastic band 20 over the rift between the outer periphery of each individuated area block D' and F' in the printed circuit board 10 being repaired and the printed circuit board 10 (see FIG. 10 and FIG. 11), thereby ensuring that the individuated area blocks D' and F' do not shift from their positions after alignment, draw a rubber roller 30 over the upper surface of each plastic band 20 to tamp them (see FIG. 12) such that the said individuated area blocks D' and F' are not susceptible to friction as they are evenly and tightly embedded in the printed circuit board 10.

8. Cure the adhesive: Put the printed circuit board 10 into an oven after tamping with the rubber roller 30 and heat until the applied liquid adhesive cures and the individuated area blocks D' and F' of the printed circuit board 10 are firmly cemented.

Figure 13:
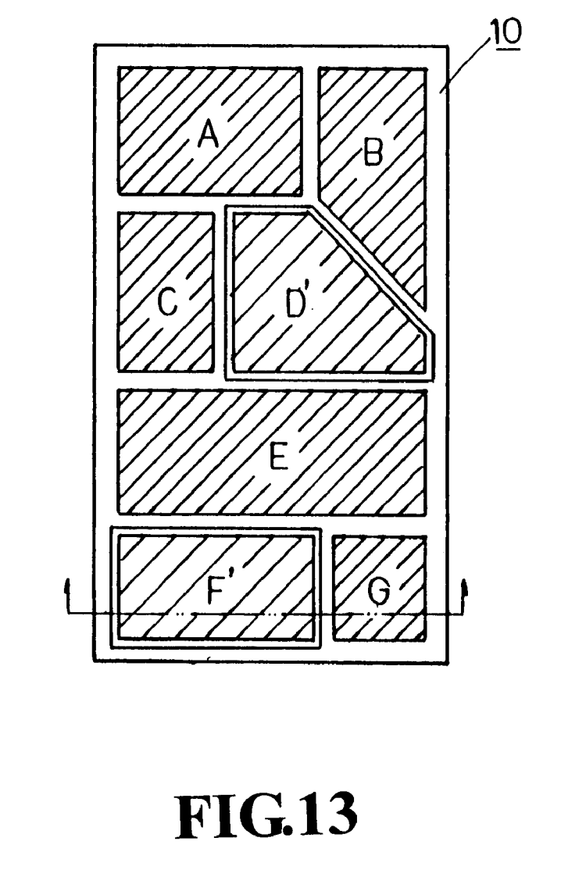
FIG. 13 is a drawing of the invention herein that illustrates the tearing off the plastic band to complete the repair of the printed circuit board.
Figure 14:
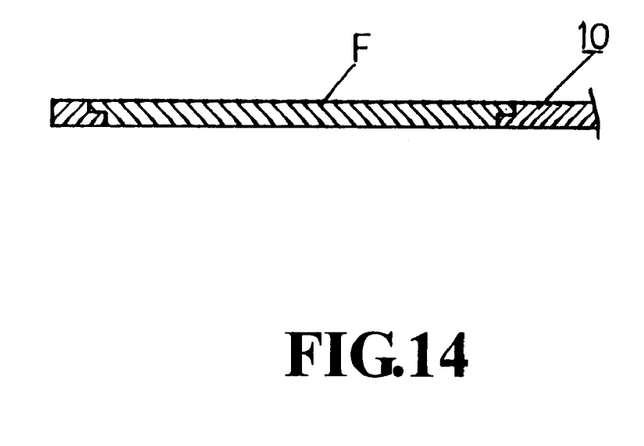
FIG. 14 is a cross-sectional drawing of FIG. 13.

9. Tear off the plastic band: Remove the plastic band 20 masked onto the printed circuit board 10 after the heating and curing operation (as shown in FIG. 13 and FIG. 14), the said individuated area blocks D' and F' of the good printed circuit board 10' providing for repair are then fully integrated with the printed circuit board 10 into a single structural entity such that the circuit board 10 under repair becomes a good product capable of continuous use.

Figure 15:
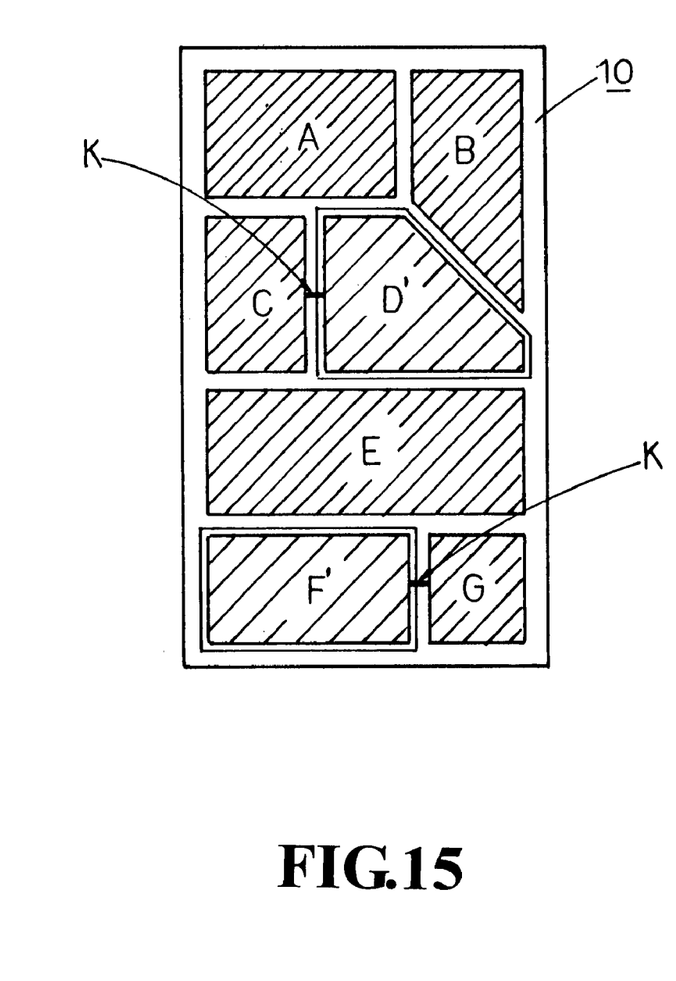
FIG. 15 is an orthographic drawing of the invention herein that depicts another printed circuit board after repair.

When the said area block plan of the printed circuit boards is plotted as per printed circuit board circuit layout requirements, the absence of cross-connected circuit traces between each said area block provides for more convenient circuit board repair, but if cross-connected circuit traces cannot be avoided in the plotting of the area blocks, referring to FIG. 15, utilizing the area block alignment reworking procedure, the individuated area blocks D' and F' are adhesively placed and accurately seated with the optical positioning instrument such that the said cross-connected circuit trace K are correspondingly aligned, then after the said individuated area blocks D' and F' are fully cemented and integrated with the printed circuit 10 into a single structural entity, the assembler only has to complete a simple soldering operation at the intersecting portions of the said correspondingly aligned circuit trace K to thereby rewire the said circuit traces into continuity. Of course, to maintain a uniform flatness of the printed circuit board 10 surface at the intersecting locations of the said cross-connected circuit trace K, a groove can be initially milled during the select area block cutting procedure to effectively achieve evenness after soldering. Additionally, smaller said area block cross-connected circuit traces facilitate the ease, simplicity, and rapidity of printed circuit board repair.

When applying the adhesive and fitting the area blocks, as per printed circuit board actual requirements, the said liquid adhesive that provides for cementing can be applied partially or fully along the stepped bonding section 101 of the empty area blocks d and f in the printed circuit board 10.

After the said plastic band 20 adhesively masked at the individuated area blocks D' and F' in the printed circuit board 10 is torn off, no gummy residue remains, thereby ensuring that various printed circuit board surface faults are not caused by left over adhesive.

The temperature and special attributes of the said heating oven provides for the hardening properties of the liquid adhesive, mainly the stable curing of the liquid adhesive and the firm cementing of the individuated area blocks D' and F' in the printed circuit board 10.

Utilizing the said arrangement of the invention herein, most printed circuit boards having trace printing faults incurred during the production and fabrication process that become defective products can be effectively restored into continuous-use good products such that printed circuit board fabrication and production is not only economical and environmentally protective, but printed circuit board manufacturing reaches maximum utilization rates, thereby minimizing waste and reducing production costs.

The invention claimed is:

1. A method of repairing a printed circuit board comprising the steps of:

inspecting like model printed circuit boards to determine which have circuit trace faults;

plotting an area block plan of the like printed circuit boards based on a layout thereof, said area block plan including a plurality of area blocks;

sorting said like printed circuit boards by defective area blocks into two major repair categories of for repair and providing for repair;

utilizing a CNC bench mill to remove a defective area block of a printed circuit board designated as for repair in the printed circuit board sorting step, thereby leaving a corresponding empty area block;

milling a stepped bonding section along interior edges of said empty area block;

placing a reverse surface of a printed circuit board designated as providing for repair in the printed circuit board sorting step on the CNC bench mill; cutting a like area block to that removed in the area block removal step from the printed circuit board designated as providing for repair to extract the like area block therefrom along plotted edges;

milling a stepped bonding section along outer edges of said like area block;

applying liquid adhesive to the stepped bonding sections of said empty area block in said printed circuit board being repaired;

placing said area block of said printed circuit board providing for the repair therein;

using an optical positioning instrument to adjust placement of said area block placed in the adhesive applying step ensuring said area block is accurately seated at in the empty area block;

applying a plastic band over a seam rift between an outer periphery of said placed area block and said printed circuit board being repaired;

rolling a rubber roller over an upper surface of said plastic band thereby evenly and tightly embedding said area block in said printed circuit board placing said printed circuit board into an oven and heating until said applied liquid adhesive cures and said area block is firmly cemented in said printed circuit board being repaired; and removing said plastic band from said printed circuit board being repaired whereby said area block of said printed circuit board providing for repair is fully integrated in said printed circuit board being repaired into a single structural entity.

2. The method as recited in claim 1 wherein said plotted area block plan is optimal when no cross-connected circuit traces are present between each said area block.

3. The method as recited in claim 1 further comprising the step of rewiring and soldering intersecting portions of correspondingly aligned, cross-connected circuit traces from two adjacent said area blocks after the step of heating said printed circuit board.

4. The method as recited in claim 1 or claim 3 further comprising the step of milling a groove at intersecting portions of said correspondingly aligned, cross-connected circuit trace from two adjacent said area blocks to provide for rewiring and soldering after the step of heating said printed circuit board.

5. The method as recited in claim 1 or claim 3 wherein said liquid adhesive is applied partially or fully along said stepped bonding section of said empty area block in said printed circuit board being repaired.

* * * * *